(12) United States Patent
Takenaga et al.

(10) Patent No.: US 10,186,429 B2
(45) Date of Patent: Jan. 22, 2019

(54) HEAT TREATMENT APPARATUS, HEAT TREATMENT METHOD, AND PROGRAM

(71) Applicant: Tokyo Electron Limited, Tokyo (JP)

(72) Inventors: Yuichi Takenaga, Iwate (JP); Hiroyuki Matsuura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 26 days.

(21) Appl. No.: 15/355,361

(22) Filed: Nov. 18, 2016

(65) Prior Publication Data

US 2017/0154786 A1 Jun. 1, 2017

(30) Foreign Application Priority Data

Nov. 26, 2015 (JP) ................... 2015-230681

(51) Int. Cl.
*H01L 21/324* (2006.01)
*H01L 21/67* (2006.01)
*H01L 21/66* (2006.01)

(52) U.S. Cl.
CPC ...... *H01L 21/324* (2013.01); *H01L 21/67109* (2013.01); *H01L 21/67248* (2013.01); *H01L 22/12* (2013.01); *H01L 22/20* (2013.01)

(58) Field of Classification Search
CPC ........ B05D 3/0218; B05C 9/14; H01L 21/324
See application file for complete search history.

(56) References Cited

U.S. PATENT DOCUMENTS

| 5,517,594 A | * | 5/1996 | Shah | ...................... | C23C 16/52 118/50.1 |
| 9,259,761 B2 | * | 2/2016 | Takenaga | ............. | B05D 3/0218 |

FOREIGN PATENT DOCUMENTS

| JP | 11-121389 A | 4/1999 |
| JP | 2013-207109 A | 10/2013 |
| JP | 2013-207110 A | 10/2013 |

* cited by examiner

*Primary Examiner* — Gregory A Wilson
(74) *Attorney, Agent, or Firm* — Abelman, Frayne & Schwab

(57) ABSTRACT

A heat treatment system includes a heating unit that heats an inside of a processing chamber that accommodates a plurality of workpieces; a pressure adjusting unit that adjusts a pressure in the processing chamber; a heat treatment condition storing unit that stores a heat treatment condition according to a heat treatment content; a heat treatment change model storing unit that stores a heat treatment change model that represents a relationship between a change of the temperature and the pressure in the processing chamber and a change of a heat treatment result; a heat treatment performing unit that performs a heat treatment according to the heat treatment condition stored in the heat treatment condition storing unit; and a calculating unit that calculates a temperature and a pressure from which a target heat treatment result is derived.

6 Claims, 9 Drawing Sheets

FIG. 4A

|  |  | Case of setting the temperature set value of ZONE 1 to +1°C | Case of setting the temperature set value of ZONE 2 to +1°C | Case of setting the temperature set value of ZONE 3 to +1°C | Case of setting the temperature set value of ZONE 4 to +1°C | Case of setting the temperature set value of ZONE 5 to +1°C |
|---|---|---|---|---|---|---|
| WAFER1 | Center | 13.6 | -0.9 | 0.4 | -0.4 | 0.0 |
|  | Middle | 12.8 | -0.7 | -0.2 | 0.2 | -0.3 |
|  | Edge | 12.7 | -0.6 | -0.3 | 0.3 | -0.30 |
| WAFER2 | Center | -0.5 | 14.1 | 0.0 | -1.1 | 0.5 |
|  | Middle | -0.7 | 13.9 | -0.9 | -0.4 | 0.1 |
|  | Edge | -0.8 | 13.8 | -1.2 | -0.3 | 0.0 |
| WAFER3 | Center | 0.0 | -0.7 | 14.0 | -0.7 | 0.1 |
|  | Middle | 0.0 | -0.7 | 13.0 | -0.5 | -0.1 |
|  | Edge | 0.0 | -0.6 | 12.8 | -0.5 | -0.1 |
| WAFER4 | Center | 0.1 | -0.7 | 0.5 | 13.2 | -0.3 |
|  | Middle | -0.1 | 0.0 | -0.7 | 13.5 | -0.8 |
|  | Edge | -0.2 | 0.1 | -1.0 | 13.5 | -1.0 |
| WAFER5 | Center | -0.1 | 0.1 | 0.4 | -1.5 | 14.0 |
|  | Middle | -0.2 | 0.3 | -0.2 | -0.9 | 12.90 |
|  | Edge | -0.3 | 0.4 | -0.3 | -0.8 | 12.7 |

|  | Case of increasing the pressure set value of ZONE 1 by +1 mTorr |
|---|---|
| WAFER1 Center | 2.23 |
| WAFER1 Middle | 2.24 |
| WAFER1 Edge | 2.25 |
| WAFER2 Center | 1.98 |
| WAFER2 Middle | 2.00 |
| WAFER2 Edge | 2.10 |
| WAFER3 Center | 1.68 |
| WAFER3 Middle | 1.65 |
| WAFER3 Edge | 1.74 |
| WAFER4 Center | 1.20 |
| WAFER4 Middle | 1.17 |
| WAFER4 Edge | 1.23 |
| WAFER5 Center | 0.71 |
| WAFER5 Middle | 0.68 |
| WAFER5 Edge | 0.72 |

(nm/mTorr)

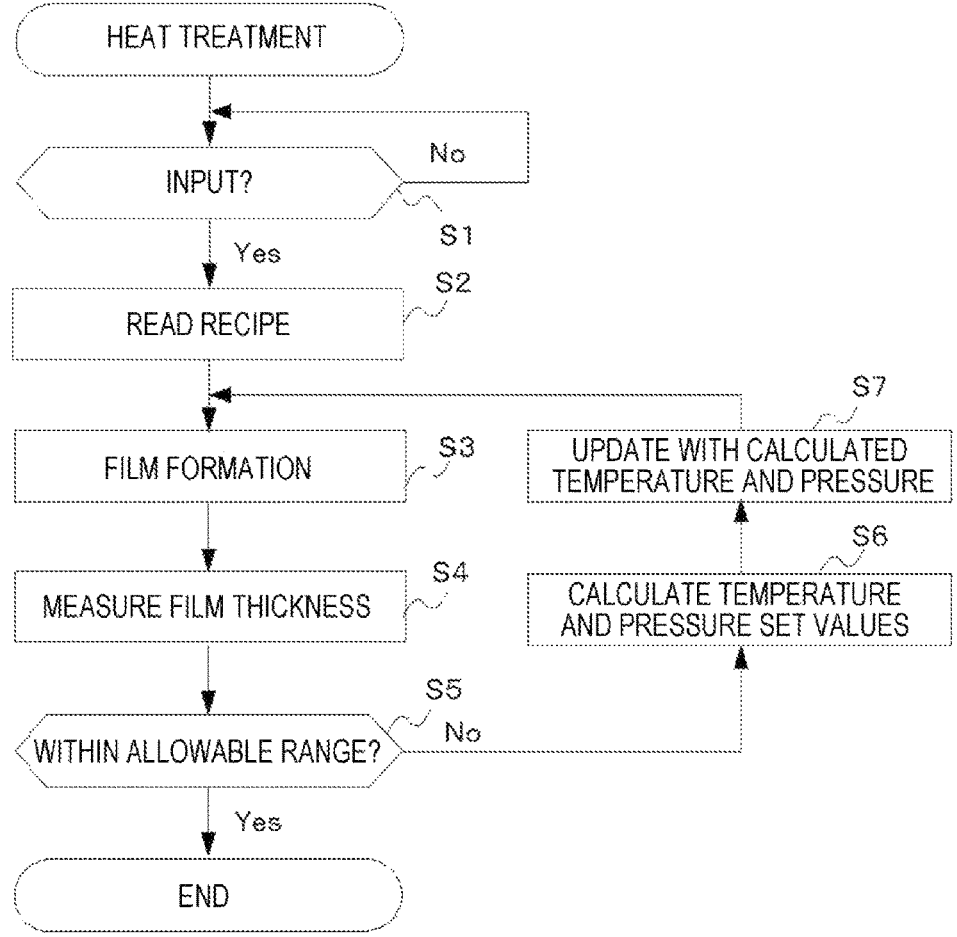

FIG. 7

|  | TEMPERATURE (°C) | PRESSURE (mTorr) |
|---|---|---|
| ZONE1 | 730.0 | |
| ZONE2 | 730.0 | |
| ZONE3 | 730.0 | 200 |
| ZONE4 | 730.0 | |
| ZONE5 | 730.0 | |

FIG. 8

|  | TEMPERATURE (°C) | PRESSURE (mTorr) |
|---|---|---|
| ZONE1 | 713.7 | |
| ZONE2 | 719.5 | |
| ZONE3 | 714.3 | 376 |
| ZONE4 | 730.3 | |
| ZONE5 | 735.4 | |

FIG. 9A

|  | Center(nm) | Middle(nm) | Edge(nm) |
|---|---|---|---|
| ZONE1 | 9.541 | 9.885 | 9.804 |
| ZONE2 | 9.595 | 9.889 | 9.805 |
| ZONE3 | 9.643 | 9.941 | 9.847 |
| ZONE4 | 9.677 | 9.957 | 9.851 |
| ZONE5 | 9.643 | 10.133 | 10.007 |

FIG. 9B

|  | Center(nm) | Middle(nm) | Edge(nm) |
|---|---|---|---|
| ZONE1 | 9.998 | 10.005 | 9.996 |
| ZONE2 | 10.006 | 9.976 | 10.018 |
| ZONE3 | 9.999 | 10.007 | 9.994 |
| ZONE4 | 9.998 | 10.003 | 10.000 |
| ZONE5 | 9.991 | 10.047 | 9.963 |

FIG. 10

|  |  | Case of setting the temperature set value of ZONE 1 to +1°C | Case of setting the temperature set value of ZONE 2 to +1°C | Case of setting the temperature set value of ZONE 3 to +1°C | Case of setting the temperature set value of ZONE 4 to +1°C | Case of setting the temperature set value of ZONE 5 to +1°C |
|---|---|---|---|---|---|---|
| WAFER1 | Center | 13.6 | -0.9 | 0.4 | -0.4 | 0.0 |
|  | Middle | 12.8 | -0.7 | -0.2 | 0.2 | -0.3 |
|  | Edge | 12.7 | -0.6 | -0.3 | 0.3 | -0.30 |
| WAFER2 | Center | -0.5 | 14.1 | 0.0 | -1.1 | 0.5 |
|  | Middle | -0.7 | 13.9 | -0.9 | -0.4 | 0.1 |
|  | Edge | -0.8 | 13.8 | -1.2 | -0.3 | 0.0 |
| WAFER3 | Center | 0.0 | -0.7 | 14.0 | -0.7 | 0.1 |
|  | Middle | 0.0 | -0.7 | 13.0 | -0.5 | -0.1 |
|  | Edge | 0.0 | -0.6 | 12.8 | -0.5 | -0.1 |
| WAFER4 | Center | 0.1 | -0.7 | 0.5 | 13.2 | -0.3 |
|  | Middle | -0.1 | 0.0 | 0.7 | 13.5 | -0.8 |
|  | Edge | -0.2 | 0.1 | -1.0 | 13.5 | -1.0 |
| WAFER5 | Center | -0.1 | 0.1 | 0.4 | -1.5 | 14.0 |
|  | Middle | -0.2 | 0.3 | -0.2 | -0.9 | 12.90 |
|  | Edge | -0.3 | 0.4 | -0.3 | -0.8 | 12.7 |

|  | TEMPERATURE (°C) | PRESSURE (mTorr) |
|---|---|---|
| ZONE1 | 722.4 | 200 |
| ZONE2 | 743.5 | |
| ZONE3 | 724.8 | |
| ZONE4 | 729.5 | |
| ZONE5 | 734.6 | |

FIG. 12

|  | Center(nm) | Middle(nm) | Edge(nm) |
|---|---|---|---|
| ZONE1 | 9.987 | 10.070 | 9.942 |
| ZONE2 | 9.987 | 10.071 | 9.942 |
| ZONE3 | 9.984 | 10.059 | 9.957 |
| ZONE4 | 9.982 | 10.072 | 9.945 |
| ZONE5 | 9.981 | 10.093 | 9.926 |

HEAT TREATMENT APPARATUS, HEAT TREATMENT METHOD, AND PROGRAM

CROSS-REFERENCE TO RELATED APPLICATIONS

This application is based on and claims priority from Japanese Patent Application No. 2015-230681 filed on Nov. 26, 2015 with the Japan Patent Office, the disclosure of which is incorporated herein in its entirety by reference.

TECHNICAL FIELD

The present disclosure relates to a heat treatment system, a heat treatment method, and a program for heat-treating a workpiece such as, for example, a semiconductor wafer. More particularly, the present disclosure relates to a batch-type heat treatment system, a heat treatment method, and a program for collectively processing a plurality of workpieces.

BACKGROUND

In a semiconductor device manufacturing process, a batch-type heat treatment system has been used to collectively perform, for example, a film formation processing, an oxidation processing, and a diffusion processing on a plurality of workpieces such as, for example, semiconductor wafers. In the batch type heat treatment system, the semiconductor wafers may be efficiently processed. However, it is difficult to ensure uniformity of the heat treatment of the plurality of semiconductor wafers.

In order to solve the problem, for example, Japanese Patent Laid-Open Publication No. 11-121389 has proposed a method of providing three or more gas injectors for an upper portion, a central portion, and a lower portion to introduce a gas into a diffusion furnace and independently controlling the flow rates thereof to make the supply amount of the gas uniform, thereby enhancing the yield of semiconductor devices.

Further, Japanese Patent Laid Open Publication No. 2013-207109 has proposed a method of adjusting the heat treatment to satisfy a target heat treatment characteristic by calculating and controlling a temperature in a reaction chamber and a gas flow rate based on a heat treatment characteristic of a formed thin film, and a model representing a relationship between a change of the temperature in the reaction chamber and the gas flow rate and a change of the heat treatment characteristic.

Japanese Patent Laid Open Publication No. 2013-207110 has proposed a method of forming a laminated film of a target film thickness by calculating weighted values of respective layers from input target film thicknesses of a first and second films, calculating activation energy of a laminated film based on the calculated weighted values and activation energy, preparing a model of the laminated film based on a relationship between the calculated activation energy and a temperature in each zone in the film thicknesses of the first and second films, and calculating and controlling the optimal temperature for each zone using the prepared model of the laminated film.

SUMMARY

According to a first aspect, the present disclosure provides a heat treatment system including a heating unit configured to heat an inside of a processing chamber that accommodates a plurality of workpieces; a pressure adjusting unit configured to adjust a pressure in the processing chamber; a heat treatment condition storing unit configured to store a heat treatment condition according to a heat treatment content, including a temperature in the processing chamber heated by the heating unit and the pressure in the processing chamber adjusted by the pressure adjusting unit; a heat treatment change model storing unit configured to store a heat treatment change model that represents a relationship between a change of the temperature and the pressure in the processing chamber and a change of a heat treatment result; a heat treatment performing unit configured to perform a heat treatment according to the heat treatment condition stored in the heat treatment condition storing unit; and a calculating unit configured to calculate a temperature and a pressure from which a target heat treatment result is derived, based on a heat treatment result obtained from a heat treatment performed by the heat treatment performing unit, the target heat treatment result, and the heat treatment change model stored in the heat treatment change model storing unit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 4A and 4B are an exemplary film thickness change model illustrating a film thickness change amount of a silicon nitride film (hereinafter, an SiN film) formed when a temperature setting value in each zone of a heater is increased by +1° C., or a pressure setting value in the reaction tube is increased by 1 mTorr, in a certain film formation condition.

FIG. 5 is a view illustrating target film thicknesses input by an operator.

FIG. 6 is a flowchart for explaining a heat treatment.

FIG. 7 is a view illustrating a temperature and a pressure stored in a recipe.

FIG. 8 is a view illustrating calculated temperature and pressure.

FIG. 9A is a view illustrating a film thickness under a fabrication condition before calculation, and FIG. 9B is a view illustrating a film thickness under a fabrication condition after calculation.

FIG. 10 is an exemplary film thickness change model representing a relationship between a change in temperature of a heater and a change in film thickness of an SiN film to be formed.

FIG. 11 is a view illustrating a calculated temperature.

FIG. 12 is a view illustrating a film thickness at the temperature of FIG. 11.

DETAILED DESCRIPTION

Figure 1:
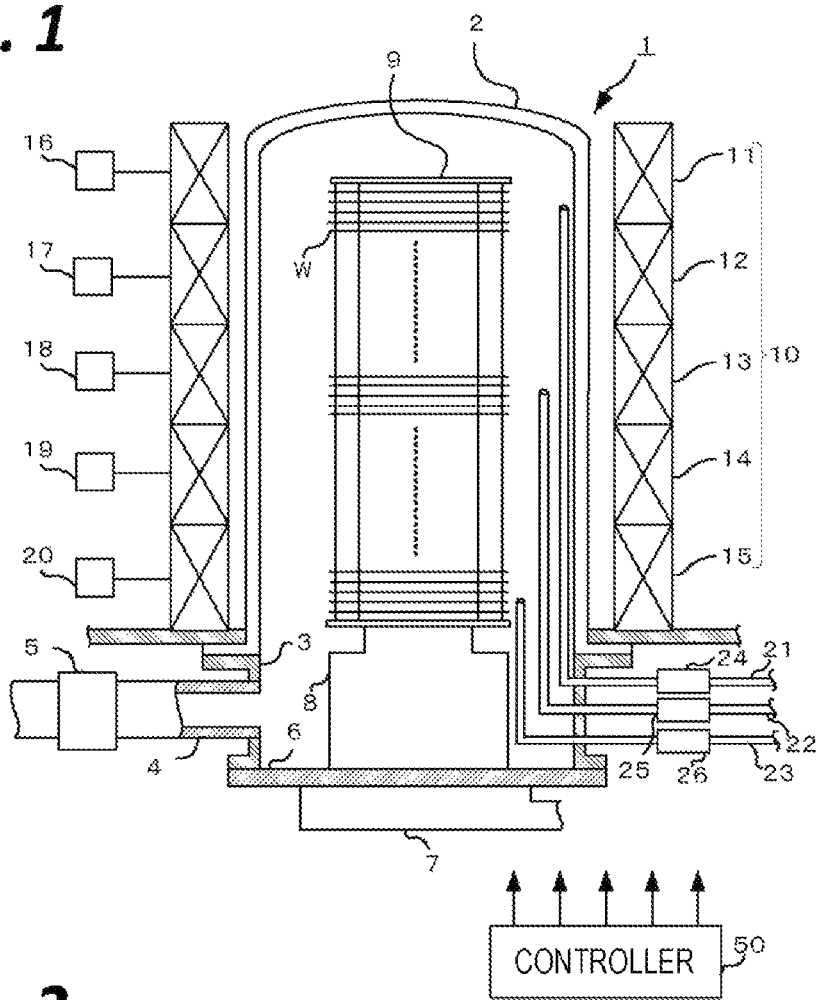
FIG. 1 is a view illustrating a structure of a heat treatment apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

With the recent miniaturization of semiconductor devices, the specification for uniformity required for the film formation has become stricter. Thus, it is required to eliminate a local variation of the film thickness such as, for example, a depression in film thickness of the thin film formed near the edge of the semiconductor wafer, and to further enhance the in-plane shape of the thin film formed on the semiconductor wafer.

The present disclosure has been made in consideration of the above circumstance, and an object of the present disclosure is to provide a heat treatment system, a heat treatment method, and a program capable of further enhancing the in-plane shape of the thin film formed on the workpiece.

According to a first aspect, the present disclosure provides a heat treatment system including a heating unit configured to heat an inside of a processing chamber that accommodates a plurality of workpieces; a pressure adjusting unit configured to adjust a pressure in the processing chamber; a heat treatment condition storing unit configured to store a heat treatment condition according to a heat treatment content, including a temperature in the processing chamber heated by the heating unit and the pressure in the processing chamber adjusted by the pressure adjusting unit; a heat treatment change model storing unit configured to store a heat treatment change model that represents a relationship between a change of the temperature and the pressure in the processing chamber and a change of a heat treatment result; a heat treatment performing unit configured to perform a heat treatment according to the heat treatment condition stored in the heat treatment condition storing unit; and a calculating unit configured to calculate a temperature and a pressure from which a target heat treatment result is derived, based on a heat treatment result obtained from a heat treatment performed by the heat treatment performing unit, the target heat treatment result, and the heat treatment change model stored in the heat treatment change model storing unit.

The heat treatment change model storing unit may additionally store a model that represents a relationship between a change of the temperature in the processing chamber and the change of the heat treatment result, and the calculating unit may calculate a temperature and a pressure, or a temperature from which the target heat treatment result is derived, based on the heat treatment result obtained from a heat treatment performed by the heat treatment performing unit, the target heat treatment result, and the heat treatment change model stored in the heat treatment change model storing unit.

The processing chamber may be divided into a plurality of zones. The heating unit may set a temperature for each of the zones in the processing chamber. The heat treatment change model stored in the heat treatment change model storing unit may represent a relationship between a change of a temperature in the processing chamber for each of the zones and a change of a heat treatment result for each of the zones. The calculating unit may calculate the temperature for each of the zones.

The heat treatment content may be a film formation processing. The heat treatment result is a film thickness of a thin film formed on the workpiece.

According to a second aspect, the present disclosure provides a heat treatment method for heating an inside of a processing chamber that accommodates a plurality of workpieces while adjusting a pressure in the processing chamber. The method includes storing a heat treatment condition according to a heat treatment content, including a temperature in the heated processing chamber and the adjusted pressure in the processing chamber; storing a heat treatment change model that represents a relationship between a change of the temperature and the pressure in the processing chamber and a change of a heat treatment result; performing a heat treatment according to the heat treatment condition stored in the heat treatment condition storing unit; and calculating a temperature and a pressure from which a target heat treatment result is derived, based on a heat treatment result obtained by performing the heat treatment, a target heat treatment result, and the heat treatment change model stored in the heat treatment change model.

According to a third aspect, the present disclosure provides a non-transitory computer-readable storage medium that stores a program which, when executed, causes a computer to function as: a heating unit configured to heat an inside of a processing chamber that accommodates a plurality of workpieces; a pressure adjusting unit configured to adjust a pressure in the processing chamber; a heat treatment condition storing unit configured to store a heat treatment condition according to a heat treatment content, including a temperature in the processing chamber heated by the heating unit and the pressure in the processing chamber adjusted by the pressure adjusting unit; a heat treatment change model storing unit configured to store a heat treatment change model that represents a relationship between a change of the temperature and the pressure in the processing chamber and a change of a heat treatment result; a heat treatment performing unit configured to perform a heat treatment according to the heat treatment condition stored in the heat treatment condition storing unit; and a calculating unit configured to calculate a temperature and a pressure from which a target heat treatment result is derived, based on a heat treatment result obtained from a heat treatment performed by the heat treatment performing unit, a target heat treatment result, and the heat treatment change model stored in the heat treatment change model storing unit.

According to the present disclosure, it is possible to provide a heat treatment system, a heat treatment method, and a program capable of further enhancing the in-plane shape of the thin film formed on the workpiece.

Hereinafter, the exemplary embodiment of the present disclosure will be described with respect to a case where the heat treatment apparatus, the heat treatment method, and the program of the present disclosure are applied to a batch type vertical heat treatment apparatus illustrated in FIG. 1. Further, in the exemplary embodiment, the present disclosure will be described with respect to a case where a SiN film is formed on a semiconductor wafer by using dichlorosilane ($SiH_2Cl_2$) and ammonia ($NH_3$) as film forming gases.

As illustrated in FIG. 1, the heat treatment apparatus 1 of the exemplary embodiment of the present disclosure includes a substantially cylindrical reaction tube 2 having a ceiling. The reaction tube 2 is arranged such that its longitudinal direction is directed in the vertical direction. The reaction tube 2 is formed of a material that is excellent in heat resistance and corrosion resistance, for example, quartz.

A substantially cylindrical manifold 3 is provided at a lower side of the reaction tube 2. The upper end of the manifold 3 is hermetically joined to the lower end of the reaction tube 2. The manifold 3 is hermetically connected to an exhaust pipe 4 to exhaust gas inside the reaction tube 2. The exhaust pipe 4 is provided with a pressure adjusting unit 5 including, for example, a valve or a vacuum pump, and adjusts the inside of the reaction tube 2 to a desired pressure (degree of vacuum).

A cover 6 is provided at a lower side of a manifold 3 (reaction tube 2). The cover 6 is configured to be movable up and down by a boat elevator 7. Thus, the cover 6 is disposed such that, when the cover 6 is moved up by the boat elevator 7, the lower side (furnace opening portion) of the manifold 3 (reaction tube 2) is closed, and when the cover 6 is moved down by the boat elevator 7, the lower side (furnace opening portion) of the manifold 3 (reaction tube 2) is opened.

A wafer boat 9 is provided above the cover 6 via a heat insulating cylinder (heat insulator) 8. The wafer boat 9 is a wafer holder that accommodates (holds) a workpiece, for example, a semiconductor wafer W. In the exemplary embodiment of the present disclosure, the wafer boat 9 is configured to accommodate a plurality (e.g., 150 sheets) of semiconductor wafers W at predetermined intervals in the vertical direction. Then, the semiconductor wafers W are accommodated in the wafer boat 9, and the cover 9 is moved up by the boat elevator 7, so that the semiconductor wafers W are loaded into the reaction tube 2.

Figure 3:
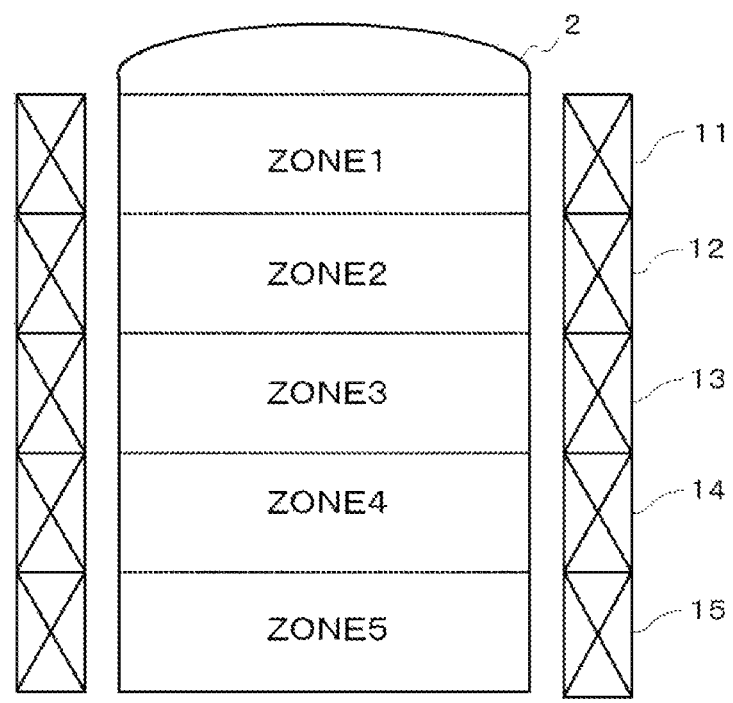
FIG. 3 is a view illustrating zones within a reaction tube.

A heater unit 10 including, for example, resistance heating elements is provided around the reaction tube 2 to surround the reaction tube 2. The inside of the reaction tube 2 is heated to a predetermined temperature by the heater unit 10. As a result, the semiconductor wafers W are heated to a predetermined temperature. The heater unit 10 is constituted with, for example, heaters 11 to 15 arranged in five tiers. The heaters 11 to 15 are connected to heater controllers 16 to 20, respectively. Therefore, since power is independently supplied to the respective power controllers 16 to 20, the respective heaters 11 to 15 may be independently heated to a desired temperature. As described above, the inside of the reaction tube 2 is divided into five zones by the heaters 11 to 15 as illustrated in FIG. 3. For example, when the top (ZONE 1) in the reaction tube 2 is heated, the power controller 16 is controlled to heat the heater 11 to a desired temperature. When the center (ZONE 3) in the reaction tube 2 is heated, the power controller 18 is controlled to heat the heater 13 to a desired temperature. When the bottom (ZONE 5) in the reaction tube 2 is heated, the power controller 20 is controlled to heat the heater 15 to a desired temperature.

Further, the manifold 3 is provided with a plurality of processing gas supply pipes to supply a processing gas into the reaction tube 2. FIG. 1 illustrates three processing gas supply pipes 21 to 23 to supply processing pipes 21 to 23 to supply the processing gas to the manifold 3. The processing gas supply pipe 21 is formed to extend from the side of the manifold 3 to the vicinity of the top of the wafer boat 9 (ZONE 1). The processing gas supply pipe 22 is formed to extend from the side of the manifold 3 to the vicinity of the center of the wafer boat 9 (ZONE 3). The processing gas supply pipe 23 is formed to extend from the side of the manifold 3 to the vicinity of the bottom of the wafer boat 9 (ZONE 5).

The processing gas supply pipes 21 to 23 are provided with flow rate adjusting units 24 to 26, respectively. Each of the flow rate adjusting units 24 to 26 is constituted with a mass flow controller (MFC) to adjust the flow rate of the processing gas flowing through the processing gas supply pipes 21 to 23. Thus, the processing gas supplied from each of the processing gas supply pipes 21 to 23 is adjusted at a desired flow rate by corresponding one of the flow rate adjusting units 24 to 26, and then, supplied into the reaction tube 2.

Figure 2:
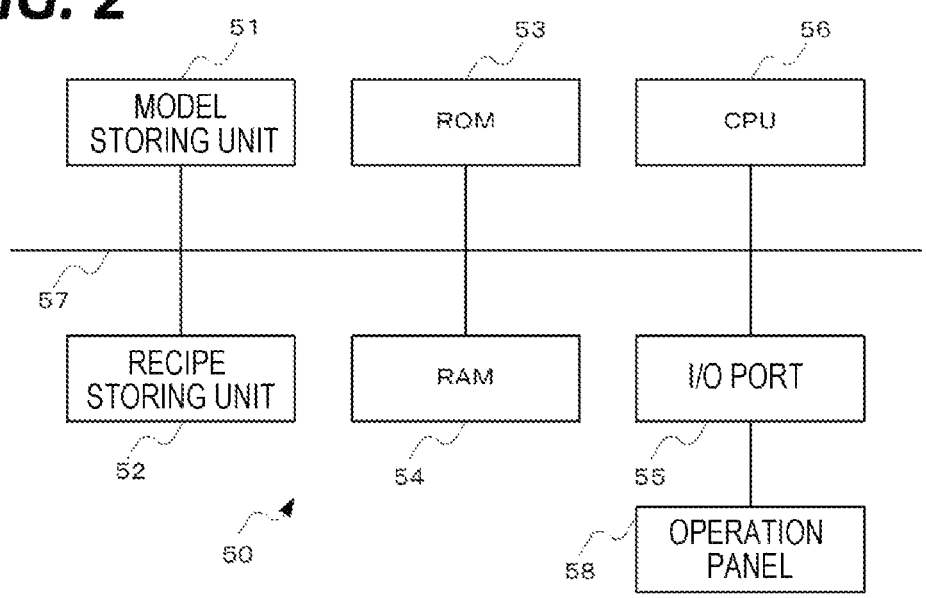
FIG. 2 is a view illustrating an exemplary configuration of the controller in FIG. 1.

Further, the heat treatment apparatus 1 includes a controller 50 configured to control processing parameters such as, for example, a gas flow rate, pressure, and temperature of the processing atmosphere in the reaction tube 2. The controller 50 outputs a control signal to, for example, the flow rate adjusting units 24 to 26, the pressure adjusting unit 5, or the power controllers 16 to 20 of the heaters 11 to 15. FIG. 2 illustrates the configuration of the controller 50.

As illustrated in FIG. 2, the controller 50 includes a model storing unit 51, a recipe storing unit 52, a read only memory (ROM) 53, a random access memory (RAM) 54, an input/output (I/O) port 55, a central processing unit 56, and a bus 57 that connects these components with each other.

The model storing unit 51 stores a film thickness change model representing a relationship of a change in temperature of the heaters 11 to 15 and a change in pressure in the reaction tube 2, with a change in film thickness of an SiN film to be formed. FIGS. 4A and 4B illustrate exemplary film thickness change models. As illustrated in FIGS. 4A and 4B, each of the film thickness change models exhibits how much the film thickness of the SiN film formed on a semiconductor wafer W (wafer) in each zone is changed when the temperature of a predetermined zone is increased by 1° C. Further, each of the film thickness change models exhibits how much the film thickness of the SiN film formed on the wafer in each zone is changed when the pressure in the reaction tube 2 is increased by 1 mTorr (0.133 Pa).

For example, as illustrated in FIG. 4A, when a temperature set value of ZONE 1 is increased by 1° C. by controlling the power controller 16 to heat the heater 11, the film thickness of the center of the SiN film formed on Wafer 1 in ZONE 1 is increased by 13.6 nm, the film thickness of an arbitrary position (middle) between the center and the edge is increased by 12.8 nm, and the edge of film thickness is increased by 12.7 nm. Further, the thickness of the center of the SiN film formed on Wafer 2 in ZONE 2 is decreased by 0.5 nm, the film thickness of the middle is decreased by 0.7 nm, and the film thickness of the edge is decreased by 0.8 nm. Further, the SiN films formed on Wafers 3 to 5 in ZONES 3 to 5 are also changed in film thickness.

In addition, as illustrated in FIG. 4B, when the pressure in the reaction tube 2 is increased by 1 mTorr (0.133 Pa) by controlling the pressure adjusting unit 5, the film thickness of the center of the SiN film formed on Wafer 1 in ZONE 1 is increased by 2.23 nm, the film thickness of the middle is increased by 2.24 nm, and the film thickness of the edge is increased by 2.25 nm. Further, the SiN films formed on wafers 2 to 5 in ZONES 2 to 5 are also increased in film thickness.

The film thickness change models may be satisfactory as long as it exhibits how much the film thickness in the center, middle, and the edge of the SiN film formed in each zone is changed when the temperature of a predetermined zone or the pressure in the reaction tube 2 is changed, but many other models may also be used. Further, in the models, since a non-optimal numerical value of default is also considered depending on the process conditions or the state of the equipment, the learning of the models may be performed by loading a learning function by adding, for example, an expansion Kalman filter to software. As for the learning function by the expansion Kalman filter, a method disclosed in, for example, U.S. Pat. No. 5,991,525 may be used.

The recipe storing unit 52 stores a process recipe that determines a control procedure depending on the kind of the film formation processing to be performed in the heat treatment apparatus 1. The process recipe is a recipe prepared for every processing (process) actually performed by a user, and defines the temperature change of each unit, the pressure change within the reaction tube 2, the timings of the start of the supply of the gas and the stop of the supply, and the supply amount, from the loading of the semiconductor wafers W onto the reaction tube 2 to the unloading of the processed semiconductor wafers therefrom.

The ROM 53 is a storage medium that is constituted by, for example, an electrically erasable programmable read-only memory (EEPROM), a flash memory, or a hard disk, and stores an operation program of the CPU 56. The RAM 54 functions as a work area of the CPU 56.

The I/O port 55 supplies a measurement signal for the temperature, the pressure, or the gas flow rate, and outputs a control signal output by the CPU 56 to the respective units (e.g., the pressure adjusting unit 5, the heater controllers 16 to 20 of the heaters 11 to 15, and the flow rate controlling units 24 to 26). Further, the I/O port 55 is connected with an operation panel 58 with which an operator operates the heat treatment apparatus 1.

The CPU 56 constitutes the core of the controller 50. The CPU 56 executes the operation program stored in the ROM 53, and according to the instructions from the operation panel 58, controls the operations of the heat treatment apparatus 1 along the process recipe stored in the recipe storing unit 52.

The CPU 56 calculates a set temperature of each of the heaters 11 to 15 disposed in each of the zones (ZONES 1 to 5) in the reaction tube 2 or a pressure in the reaction tube 2 where the target film thickness is achieved, based on the film thickness change model stored in the model storing unit 51 and the film thickness of the formed SiN film. The bus 57 transmits information between the respective units.

Next, descriptions will be made on a heat treatment method using the heat treatment apparatus 1 configured as described above. In the heat treatment of the exemplary embodiment, an operator operates the operation panel 58 to select a process type, (in this exemplary embodiment, a film formation of the SiN film with dichlorosilane and ammonia), and input target film thicknesses of the center, the middle, and the edge of the semiconductor wafer W with respect to a film thickness of the SiN film to be targeted. FIG. 6 is a flowchart for explaining the heat treatment of the exemplary embodiment of the present disclosure.

First, the controller 50 (CPU 56) determines whether the required information (e.g., the process type) is input (step S1). When it is determined that the required information is input (step S1; Yes), the CPU 56 reads a process recipe corresponding to the input information, from the process recipe storing unit 52 (step S2). In the process recipe, for example, as illustrated in FIG. 7, a process condition (e.g., a temperature or a pressure in the reaction tube 2) is stored for every area.

Next, the CPU 56 causes the boat elevator 7 (cover 6) to be moved down so that the wafer boat 9 equipped with at least a semiconductor wafer W (monitor wafer) in each zone is disposed on the cover 6. Subsequently, the CPU 56 causes the boat elevator 7 (cover 6) to be moved up so that the wafer boat 9 (the semiconductor wafer W) is loaded into the reaction tube 2. Then, the CPU 56 controls the pressure adjusting unit 5, the power controllers 16 to 20 of the heaters 11 to 15, and the flow rate adjusting units 24 to 26 along the recipe to form a SiN film on the semiconductor wafer W (step S3).

When the film formation processing is completed, the CPU 56 measures the film thickness of the formed SiN film (step S4). For example, the CPU 56 causes the boat elevator 7 (cover 6) to be moved down so that the semiconductor wafer W formed with the SiN film is unloaded, and the semiconductor wafer W is conveyed to, for example, a measurement device (not illustrated) so that the measurement device measures the film thickness of the SiN film formed on the semiconductor wafer W. In the measurement device, when the film thickness of the SiN film formed on the semiconductor wafer W is measured, the measured film thickness data of the SiN film, for example, as illustrated in FIG. 9A is transmitted to the heat treatment apparatus 1 (CPU 56). Upon receiving the measured film thickness data of the SiN film, the CPU 56 specifies the film thickness of the formed SiN film. Alternatively, the operator may operate the operation panel 58 to input the measurement result.

Upon specifying the film thickness of the formed SiN film, the CPU 56 determines whether the measured film thickness falls within an allowable range (step S5). The wording "within an allowable range" refers to "within a predetermined allowable range from the input target film thickness," for example, within ±1% from the input target film thickness. Further, the operator may determine whether the measured data falls within the predetermined allowable range, and operate the operation panel 58 to input the result.

When it is determined that the measured film thickness does not fall within the allowable range (step S5: No), the CPU 56 calculates a temperature set value and a pressure set value to be matched with the target film thickness (step S6). For example, as illustrated in FIG. 8, the CPU 56 calculates a temperature of each of the heaters 11 to 15 disposed in each of the zones (ZONES 1 to 5) in the reaction tube 2 and a pressure in the reaction tube 2 where the target film thickness is achieved, based on the measured film thickness and the film thickness change model stored in the model storing unit 51. Then, the CPU 56 updates the temperature of each of the zones of the read recipe with the calculated set temperature and pressure (step S7). Then, the CPU 56 returns to step S3, and forms an SiN film on the semiconductor wafer W.

That is, the CPU 56 controls the power controllers 16 to 20 such that the temperature of the heater 11 is 713.7° C., the temperature of the heater 12 is 719.5° C., the temperature of the heater 13 is 714.3° C., the temperature of the heater 14 is 730.3° C., and the temperature of the heater 15 is 735.4° C. In addition, the CPU 56 controls the pressure adjusting unit 5 such that the pressure in the reaction tube 2 is 376 mTorr (50 Pa). Then, the SiN film is formed on the semiconductor wafer W (step S3).

When the film formation processing is completed, the CPU 56 measures the film thickness of the formed SiN film using, for example, a measurement device (not illustrated) (step S4). Then, the CPU 56 determines whether the measured film thickness falls within the allowable range (step S5). In the case of the exemplary embodiment, the measured film thickness of the SiN film falls within the allowable range. When it is determined that the measured film thickness falls within the allowable range (step S5: Yes), the CPU 56 terminates the processing.

Thus, the fabrication condition may be easily adjusted such that the film thickness of the SiN film formed on the semiconductor wafer W becomes uniform. When it is determined that the measured film thickness and the target film thickness do not substantially coincide with each other (step S5; No), the CPU 56 executes steps S6, S7, and S3 to S5 again.

As described above, according to the exemplary embodiment of the present disclosure, the in-plane shape of the semiconductor wafer W may be easily controlled by an operator who merely inputs a target film thickness.

Further, the present disclosure is not limited to the above-described exemplary embodiment, and various modifications and applications may be made thereto. Hereinafter, descriptions will be made on other exemplary embodiments that are applicable to the present disclosure.

In the above-described exemplary embodiment, the present disclosure has been described with respect to the case where the temperature of each of the heaters 11 to 15 and the pressure in the reaction tube 2 are calculated using the film thickness change model representing a relationship of the change in temperature of each of the heaters 11 to 15 and the change in pressure in the reaction tube 2 with the change in film thickness of the SiN film to be formed, but the present disclosure is not limited thereto. For example, the model storing unit 51 may store a film thickness change model representing a relationship between the change in temperature of each of the heaters 11 to 15 and the change in film thickness of the SiN film to be formed, as illustrated in FIG. 10, and the film thickness may be adjusted by the temperature of each of the heaters 11 to 15 and the pressure in the reaction tube 2, or the temperature of each of the heaters 11 to 15, depending on the heat treatment content, or by an operator's selection.

Similarly to the exemplary embodiment of the present disclosure, the temperature of each of the heaters 11 to 15 was adjusted by the film thickness change model representing the relationship between the change in temperature of each of the heaters 11 to 15 and the change in film thickness of the SiN film to be formed, as illustrated in FIG. 10. Specifically, in the SiN film formation of step S3, the temperature of each of the heaters 11 to 15 was calculated as illustrated in FIG. 11, using the film thickness change model illustrated in FIG. 10 when the measurement result illustrated in FIG. 9A was obtained. Then, the temperature of each zone of the read recipe was updated with a calculated temperature (step S7). Then, the process returned to step S3 so that the SiN film was formed on the semiconductor wafer W.

That is, the CPU 56 controlled the power controllers 16 to 20 such that the temperature of the heater 11 was 722.4° C., the temperature of the heater 12 was 743.5° C., the temperature of the heater 13 was 724.8° C., the temperature of the heater 14 was 729.5° C., and the temperature of the heater 15 was 735.4° C., thereby forming the SiN film on the semiconductor wafer W. The result is illustrated in FIG. 12. As illustrated in FIG. 12, it has been confirmed that the in-plane shape of the SiN film to be formed on the semiconductor wafer W may be easily controlled even in the case where the film thickness is adjusted by the temperature of each of the heaters 11 to 15.

As described above, an operator may select the case of adjustment by the temperature of each of the heaters 11 to 15 and the pressure in the reaction tube 2 or the case of adjustment by the temperature of each of the heaters 11 to 15.

In the above-described exemplary embodiment, the present disclosure has been described with respect to the case where the target film thicknesses of the center, the middle, and the edge are input for every zone of the SiN film to be formed. However, for example, the target film thicknesses of the center and the edge may be input for every zone.

In the above-described exemplary embodiment, the present disclosure has been described with respect to the case where the number of tiers of the heaters (the number of zones) is five. However, the number of tiers may be four or less, or six or more. Further, the number of semiconductor wafers W extracted from each zone may be arbitrarily set.

In the above-described exemplary embodiment, the present disclosure has been described with respect to the case where the film formation temperature in the film formation processing was constant. For example, however, the film formation temperature in the film formation processing may be gradually reduced (decreased) in each zone. In this case, the CPU 56 is able to improve the accuracy of the temperature to be decreased (calculate the optimum temperature), for example, by storing a plurality of models representing a relationship between a recipe of the case where the film formation temperature is gradually reduced (decreased), and a change in film thickness of the SiN film to be formed.

In the above-described exemplary embodiment, the present disclosure has been described with respect to the case where the SiN film is formed using dichlorosilane and ammonia. For example, however, the present disclosure may also be applied to formation of various thin film, for example, formation of an $SiO_2$ film using dichlorosilane and dinitrogen monoxide.

In the above-described exemplary embodiment, the present disclosure has been described with respect to the case where the SiN film is formed. However, the kind of the processing is optional, and the present disclosure is applicable to various heat treatment apparatuses for forming other kinds of films such as, for example, a chemical vapor deposition (CVD) apparatus and an oxidation apparatus.

In the above-described exemplary embodiment, the present disclosure has been described with respect to the case where the batch type heat treatment apparatus has a single tube structure. However, the present disclosure may also be applied to a batch type vertical heat treatment apparatus having a double tube structure in which the reaction tube 2 is constituted by an inner tube and an outer tube. Further, the present disclosure is not limited to the processing of semiconductor wafers, but is also applicable to a processing of, for example, flat panel display (FPD) substrates, glass substrates, or plasma display panel (PDP) substrates.

The controller 50 related to the exemplary embodiment of the present disclosure may be realized using a general computer system without a dedicated system. For example, the controller 50, which executes the processing described above, may be constituted by installing a program for executing the processing described above from a storage medium (e.g., a flexible disc or a compact disc read only memory (CD-ROM)) storing the program to a general purpose computer.

And, the means to supply the program is optional. The program may be supplied via, for example, a communication line, a communication network, or a communication system, besides the predetermined storage medium as described above. In this case, the program is uploaded on, for example, a bulletin board system (BBS) of a communication network, and provided in superposition on a carrier wave via a network. Then, the thus-provided program is started and executed similarly to other application programs under a control of an operating system (OS), so that the above-described processing is performed.

The present disclosure is useful for a heat treatment system for performing a heat treatment on a workpiece such as, for example, a semiconductor wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment system, comprising:
a heating unit configured to heat an inside of a processing chamber that accommodates a plurality of workpieces;
a pressure adjusting unit configured to adjust a pressure in the processing chamber;
a recipe storing unit configured to store a heat treatment condition according to a heat treatment content, including a temperature in the processing chamber heated by the heating unit and the pressure in the processing chamber adjusted by the pressure adjusting unit;
a model storing unit configured to store a heat treatment change model that represents a relationship between a change of the pressure in the processing chamber and a change of a heat treatment result;
a heater controller configured to perform a heat treatment according to the heat treatment condition stored in the recipe storing unit; and
a calculating unit configured to calculate a temperature and a pressure from which a target heat treatment result is derived, based on a heat treatment result obtained from a heat treatment performed by the heater controller, the target heat treatment result, and the heat treatment change model stored in the model storing unit.

2. The heat treatment system of claim 1, wherein the model storing unit is configured to additionally store a model that represents a relationship between a change of the temperature in the processing chamber and the change of the heat treatment result, and
the calculating unit is configured to calculate a temperature and a pressure, or a temperature, from which the target heat treatment result is derived, based on the heat treatment result obtained from the heat treatment performed by the heater controller, the target heat treatment result, and the heat treatment change model stored in the model storing unit.

3. The heat treatment system of claim 1, wherein the processing chamber is divided into a plurality of zones,
the heating unit sets a temperature for each of the zones in the processing chamber,
the heat treatment change model stored in the model storing unit represents a relationship between a change of a temperature in the processing chamber for each of the zones and a change of a heat treatment result for each of the zones, and
the calculating unit is configured to calculate the temperature for each of the zones.

4. The heat treatment system of claim 1, wherein the heat treatment content is a film formation processing, and
the heat treatment result is a film thickness of a thin film formed on the workpiece.

5. A heat treatment method for heating an inside of a processing chamber that accommodates a plurality of workpieces while adjusting a pressure in the processing chamber, the method comprising:
storing a heat treatment condition according to a heat treatment content, including a temperature in the heated processing chamber and the adjusted pressure in the processing chamber in a recipe storing unit;
storing a heat treatment change model that represents a relationship between a change of the pressure in the processing chamber and a change of a heat treatment result in a model storing unit;
performing a heat treatment according to the heat treatment condition stored in the recipe storing unit; and
calculating a temperature and a pressure from which a target heat treatment result is derived, based on a heat treatment result obtained by performing the heat treatment, a target heat treatment result, and the heat treatment change model stored in the model storing unit.

6. A non-transitory computer-readable storage medium that stores a program which, when executed, causes a computer to function as:
a heating unit configured to heat an inside of a processing chamber that accommodates a plurality of workpieces;
a pressure adjusting unit configured to adjust a pressure in the processing chamber;
a recipe storing unit configured to store a heat treatment condition according to a heat treatment content, including a temperature in the processing chamber heated by the heating unit and the pressure in the processing chamber adjusted by the pressure adjusting unit;
a model storing unit configured to store a heat treatment change model that represents a relationship between a change the pressure in the processing chamber and a change of a heat treatment result;
a heater controller configured to perform a heat treatment according to the heat treatment condition stored in the recipe storing unit; and
a calculating unit configured to calculate a temperature and a pressure from which a target heat treatment result is derived, based on a result obtained from a heat treatment performed by the heater controller, a target heat treatment result, and the heat treatment change model stored in the model storing unit.

* * * * *